United States Patent
Kogano et al.

(10) Patent No.: US 6,503,079 B2
(45) Date of Patent: Jan. 7, 2003

(54) SUBSTRATE PROCESSING APPARATUS AND METHOD FOR MANUFACTURING SEMICONDUCTOR DEVICE

(75) Inventors: Minoru Kogano, Tokyo (JP); Yasuhiro Inokuchi, Tokyo (JP); Makoto Sambu, Tokyo (JP); Atsushi Moriya, Tokyo (JP); Yasuo Kunii, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/041,617

(22) Filed: Jan. 10, 2002

(65) Prior Publication Data

US 2002/0094502 A1 Jul. 18, 2002

(30) Foreign Application Priority Data

Jan. 15, 2001 (JP) .......................................... 2001-006690

(51) Int. Cl.$^7$ ................................................. F27D 3/12
(52) U.S. Cl. ......................... 432/242; 432/239; 432/249; 118/50
(58) Field of Search ................................ 432/239, 241, 432/242, 247, 249, 253; 392/416, 418; 118/50, 724, 725, 726, 728; 438/660, 663, 715

(56) References Cited

U.S. PATENT DOCUMENTS 5,328,360 A * 7/1994 Yokokawa ................... 432/241
5,330,352 A * 7/1994 Watanabe et al. ............ 432/241
5,951,282 A * 9/1999 Sakata et al. ................ 432/241
6,142,773 A * 11/2000 Shimazu ...................... 432/241

FOREIGN PATENT DOCUMENTS

| JP | A 62-235729 | 10/1987 |
| JP | A 8-148441 | 6/1996 |
| JP | A 10-223538 | 8/1998 |

* cited by examiner

*Primary Examiner*—Gregory A. Wilson
(74) *Attorney, Agent, or Firm*—Oliff & Berridge, PLC

(57) ABSTRACT

An apparatus and a method for manufacturing a semiconductor device can provide a good quality film growth in a highly clean reaction atmosphere unaffected by contamination from a furnace opening portion. A reverse-diffusion preventing body 8 is provided between a furnace opening flange 7 and a boat susceptor 19 so that a substrate processing space 20 is isolated from a furnace opening portion space 21 to thereby prevent reverse-diffusion of a contaminant which occurs at a furnace opening portion B, to the substrate processing space 20. At a furnace opening flange 7, a furnace opening exhausting tube 15 is provided which constitutes a furnace opening system for exhausting the space 21 independently of the space 20 so that the space 21 is exhausted while being purged by supplying a purge gas into the space 21, to thereby remove a contaminant from the space 21. A gas supplying nozzle 4 which is introduced from the flange 7 is extended from the space 21 to the space 20 so that a reaction gas is directly introduced into the space 20 to thereby prevent a contaminant Within the space 21 from being involved in the space 20.

18 Claims, 5 Drawing Sheets

SUBSTRATE PROCESSING APPARATUS AND METHOD FOR MANUFACTURING SEMICONDUCTOR DEVICE

BACKGROUND OF THE INVENTION

1. Field of the Invention

This invention relates to a substrate processing apparatus and a method for manufacturing a semiconductor device, and is preferable particularly for a vertical apparatus for performing a batch process on a plurality of semiconductor substrates.

2. Description of the Related Art

A conventional reaction furnace of a vertical apparatus, for example, a furnace of double tube structure, includes an outer reaction tube and an inner reaction tube which are disposed coaxially with each other An upper portion of the outer reaction tube is blocked and a lower portion of the outer reaction tube is opened, and both upper and lower portions of the inner reaction tube are opened The lower openings of the outer reaction furnace and the inner reaction furnace are connected a furnace opening flange which it provided with a gas introducing nozzle and a gas exhausting opening. A furnace opening of the furnace opening flange is covered with a seal cap which is provided at a lower portion of a boat inserted into the inner reaction tube. A number of wafers are loaded on the boat, and a batch process is performed on the wafers In a reaction atmosphere.

An interior of the reaction furnace is evacuated to vacuum, and then, a reaction gas is introduced through the gas introducing nozzle, and the reaction gas accompanied with an atmosphere within the lower portion of the furnace enters into the inner reaction tube, and flows upwardly while being In contact with a number of wafers loaded on the boat. In this case, the reaction gas is decomposed by heating the wafers, and the reaction product is deposited onto a surface of the wafers so as to form a film. After the processing, the gas is reversed at the upper portion of the outer reaction furnace, and then flows downwardly through a path defined between the outer reaction tube and the inner reaction tube so as to be exhausted from the lower portion of the furnace. Therefore, in the apparatus of double tube structure, the flow of the gas in the reaction atmosphere where the wafers exist Is from below to above.

In the seal cap for covering the above-mentioned furnace opening flange and the furnace opening, an O-ring for vacuum sealing is frequently used. Therefore, a component of the O-ring may be released from the O-ring in the form of a gas, or an outside atmosphere may get into a furnace by leakage from the sealing. Furthermore, in some apparatuses, a boat rotation mechanism for rotating a boat during film formation may be attached to a seal cap, therefore, the rotation mechanism may be another contamination source. These contamination sources are concentrated on a furnace opening portion at a lower portion of a reaction furnace. Accordingly, the furnace opening may be a contamination source for contaminating a reaction atmosphere.

In the above-mentioned reaction furnace of double tube structure, the contamination source of the furnace opening portion is located upstream of the flow of the gas in the reaction atmosphere where wafers exist. Therefore, the gas introduced from the lower portion reaches the wafers while containing the contaminant generated from the contamination source which is located in the upstream. As a result, the contaminant contained in the gas adheres to the wafers so that a haze which causes the film formation surface to cloud and the like are generated thereby leading to a cause of a poor film growth. Moreover, in a process such as an epitaxial growth and the like, which requires a highly clean reaction atmosphere, the above-mentioned contaminant may inhibit a process reaction and may hinder adhesion of a reaction gas thereby leading to a factor responsible for deterioration In doping amount uniformity.

In addition, the above-mentioned problem is also encountered In a reaction furnace of single tube structure. In some reaction furnaces of single tube structure without an inner reaction tube, a gas introducing nozzle is extended to an upper portion within a reaction tube, and a reaction gas is supplied from the upper portion to the lower portion and exhausted from the lower portion of the reaction tube. In this case, although a contaminant source will exist downstream of the gas, a contaminant at a furnace opening portion is whirled up when the gas is exhausted from the lower furnace portion so that the contaminant reaches wafers by reverse-diffusion thereby causing a similar problem as mentioned-above.

SUMMARY OF THE INVENTION

An object of the present invention is to provide a substrate processing apparatus and a method for manufacturing a semiconductor device wherewith, by resolving the problems with the prior art noted In the foregoing, a process in a highly clean atmosphere without contamination can be accomplished.

The invention of claim 1 resides in a substrate processing apparatus comprising: a furnace for processing at least a single substrate therein, with a furnace opening covered with a seal cap; a reverse-diffusion preventing body, provided between a substrate processing space and a furnace opening portion space at a side of the furnace opening, within the furnace, for preventing reverse-diffusion of a contaminant at the side of the furnace opening from the furnace opening portion space to the substrate processing space; a reaction gas introducing system for introducing a reaction gas into the furnace so as to process the substrate; a process exhausting system for exhausting the introduced reaction gas from substrate processing space; and a furnace opening exhausting system for exhausting the furnace opening portion space independently of the substrate processing space.

Since measures against contamination at the side of the furnace opening is designed in such a way that a reverse-diffusion preventing body is provided between a substrate processing space and a furnace opening portion space, and that the furnace opening portion space is exhausted independently of the substrate processing space, it is possible to effectively prevent reverse-diffusion of a contaminant from the furnace opening portion space to the substrate processing space.

The above-mentioned substrate processing apparatus includes a surface processing apparatus, a film formation apparatus, an epitaxial film formation apparatus, an SiGe film formation apparatus, and the like.

The invention of claim 2 resides in a substrate processing apparatus according to claim 1, comprising a purge gas Introducing system for purging an inside of the furnace opening portion space by supplying an inert gas such as $N_2$ and the like, or $H_2$ gas into the furnace opening portion space. The furnace opening portion space is exhausted while being purged by supplying an inert gas such as $N_2$ and the like, or $H_2$ gas into the furnace opening portion space, to thereby more effectively prevent reverse-diffusion of a contaminant.

The invention of claim 3 or 4 resides in a substrate processing apparatus according to claim 1 or 2, wherein a pressure of the furnace opening portion space is kept lower than a pressure of the substrate processing space. It is possible to still more effectively prevent reverse-diffusion of a contaminant by keeping a pressure of the furnace opening portion space lower than a pressure of the substrate processing space.

The invention of claims 5 through 8 resides in a substrate processing apparatus according to claims 1 through 4, respectively, wherein the reaction gas introducing system is configured to directly supply the reaction gas into the substrate processing space. Since the reaction gas is directly supplied into the substrate processing space so that the reaction gas does not allow a contaminant within the furnace opening portion space to be involved in the substrate processing space, it is possible to still more effectively prevent reverse-diffusion of a contaminant.

The invention of claims 9 through 16 resides in a substrate processing apparatus according to claims 1 through 8, respectively, wherein the process of the substrate is a process for forming an epitaxial film onto a substrate surface. The substrate processing apparatus of this invention is used preferably in the case that the substrate process is a film formation of an epitaxial film, and it is used, in particular, preferably in the case of a film formation of an SiGe film.

The invention of claim 17 resides in a method for manufacturing a semiconductor device, comprising the steps of: inserting at least a single semiconductor substrate into a furnace and covering a furnace opening with a seal cap; preventing reverse-diffusion of a contaminant at the furnace opening portion from a furnace opening portion space at the side of the furnace opening to a substrate processing space, within the furnace; introducing a reaction gas into the furnace so as to process the semiconductor substrate; exhausting the introduced gas, from the substrate processing space: and exhausting the furnace opening portion space independently of the substrate processing space.

According to this invention, since measures against contamination at the side of the furnace opening is designed to comprise the steps of; preventing reverse-diffusion of a contaminant from a furnace opening portion space to a substrate processing space; and exhausting the furnace opening portion space independently of the substrate processing space, it is possible to effectively prevent reverse-diffusion of a contaminant from the furnace opening area to the substrate processing space. The invention of claim 18 resides in a method for manufacturing a semiconductor device, according to claim 17. wherein the reaction gas is a gas for forming an SiGe film. A gas for forming an SiGe film is, for example, a mixed gas of monosilane ($SiH_4$). monogermane ($GeH_4$), monomethylsilane ($CH_3SiH_3$), diborane ($B_2H_6$) and hydrogen ($H_2$).

DESCRIPTION OF THE PREFERRED EMBODIMENTS

Embodiments of the present invention will be described below.

Figure 1:
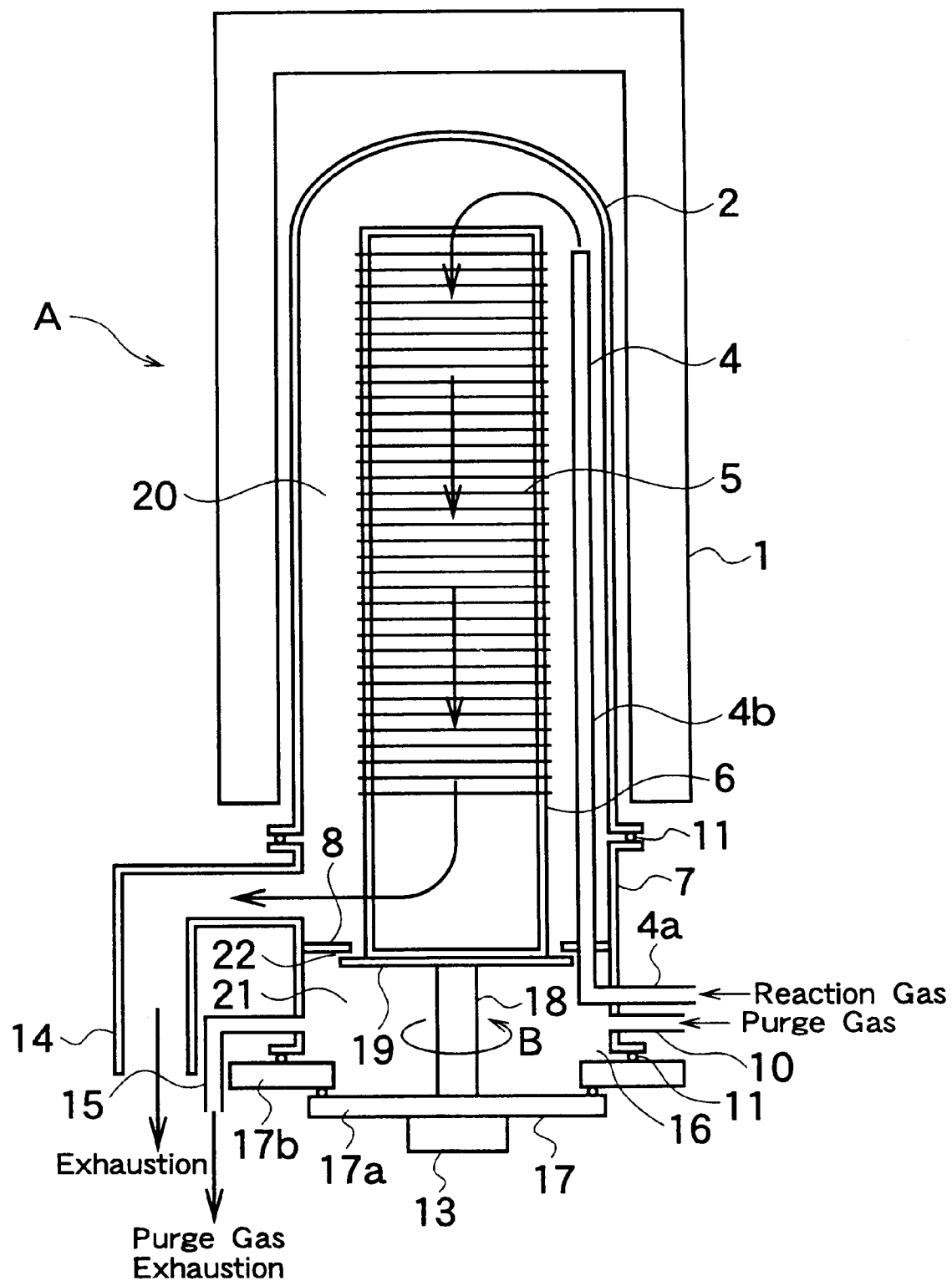
FIG. 1 is a schematic cross-sectional view for explaining a reaction furnace (single tube structure) of a vertical apparatus of an embodiment.

A first embodiment of the present invention will be described by using FIG. 1. FIG. 1 is a schematic view for explaining a reaction furnace A of a vertical apparatus according to a substrate processing apparatus for performing a method for manufacturing a semiconductor device. Here, the reaction furnace is designed to be a single tube structure.

Within a heater 1 which is closed at its upper portion, a cylindrical reaction tube 2 made of quartz which is closed at its upper portion is provided coaxially with the heater 1. The reaction tube 2 is vertically disposed on a furnace opening flange 7 made,of stainless steel in the form of a short tube, and the opening of the reaction tube 2 and the upper end of the furnace opening flange 7 is sealed therebetween by an O-ring 11. A furnace opening 16 at the lower end of the furnace opening flange 7 is airtightly covered by a seal cap 17 via the O-ring 11. A boat 6 which is vertically disposed on the seal cap 17 is inserted into the reaction tube 2. In the boat 6, a plurality of wafers 5 such as silicon wafers and the like are loaded being horizontally oriented in a multi-storied fashion, and these wafers 5 are subjected to batch processing. The furnace opening flange 7 is airtightly covered by a seal cap 17 so as to configure one closed space (a reaction chamber) in which the reaction tube 2 and the furnace opening flange 7 are in fluid communication with each other.

The seal cap 17 on which the boat 6 is vertically disposed is provided with a boat rotation mechanism 13, a rotation shaft 18 and a boat susceptor 19. The seal cap is of double structure which comprises a disk 17a having a diameter approximately equal to the diameter of the reaction tube 2 and a ring 17b having a diameter approximately equal to the diameter of the heater 1 which is stacked on the outer periphery of the disk 17a via the O-ring 11. The disk 17a and the hollow ring 17b airtightly covers the furnace opening 16 of the furnace opening flange 7 via the O-ring 11. Thus, many O-rings for establishing a vacuum seal are used for the seal cap 17.

The disk-like boat susceptor 19 having a diameter approximately intermediate between the diameter of the reaction tube 2 and the diameter of the boat 6 is attached to the upper end of the rotation shaft 18 which is inserted through the seal cap 17 from the back surface thereof, and the boat 6 is vertically disposed on the susceptor 19. The rotation shaft 18 is rotated by the boat rotation mechanism 13 which is attached to the back surface of the seal cap 17, and therefore the boat rotation mechanism 13 rotates the boat 6 which is vertically disposed on the disk-like boat susceptor 19 within the reaction tube 2.

When the boat 6 is inserted, the closed space of the furnace can be divided into a substrate processing space 20 at the upper side of the furnace and a furnace opening portion space 21 at the lower side of the furnace which are just separated by the boat susceptor 19 as a boundary. The substrate processing space 20 which is defined by the top of the reaction tube 2 and the boat susceptor 19 in the vertical direction, comprises a furnace forward portion chamber in which the boat 6 is housed for processing of the wafers 5. The furnace opening portion space 21 which is defined by the boat susceptor 19 and the seal cap 17, comprises a furnace opening chamber including a furnace opening portion B representing the vicinity of the rotation shaft 18 and the furnace opening 16.

At the furnace opening flange 7, a reaction gas is introduced into the substrate processing space 20 as well as an atmosphere of the substrate processing space 20 is exhausted. That is, at the upper portion of the furnace opening flange 7 which defines the lower portion of the substrate processing space 20, a gas exhausting tube 14 is provided which is in fluid communication with the substrate processing space 20 for exhaustion of the substrate processing space 20. The gas exhausting tube 14 together with a valve and a pump which are not shown in the drawing constitutes a gas exhausting system. In addition, a gas introducing tube 4 is connected to the lower portion of the furnace opening flange 7 which defines the furnace opening portion space 21 so that the reaction gas is introduced from the gas introducing tube 4 into the substrate processing space 20 and the reaction gas is exhausted from the gas exhausting tube 14. The gas introducing tube 4 together with a gas supplying tube and a gas supplying source which are not shown in the drawing constitutes a reaction gas introducing system.

According to the construction which has been explained above, it was discovered that, when a film formed on a wafer is an SiGe film, a haze occurs if a organic contaminant or the like is present even in small amounts. The reason why the haze occurs is considered as follows.

(1) mixing of moisture from the air which is due to a very small amount of leakage from the sealed portion of the furnace opening 16 sealed by the seal cap 17;

(2) an organic contaminant which is resulted from a component of the O-ring 11 released in the form of a gas from the O-ring 11 for sealing provided on the seal cap 17, or a contamination source of carbon (C) or fluorine (F) which results from volatilization of a magnetic fluid used for the boat rotation mechanism 13 provided on the seal cap 17; and (3) transfer of a contaminant in large amounts to wafers which results when the reaction gas is supplied toward the reaction tube 2 from the furnace opening portion B which is located at the side of the contamination source.

Therefore, in an embodiment of the present invention, the following constructions (A) to (C) are added to the above-mentioned construction to take measures against the contamination of the furnace opening portion B.

(A) First of all, the substrate processing space 20 and the furnace opening portion space 21 are isolated. That is, a reverse-diffusion preventing body 8 is provided between the furnace opening portion space 21 which is located at a side of the furnace opening 16 and the substrate processing space 20 which is located at an opposite side to the furnace opening 16. The reverse-diffusion preventing body 8 prevents reverse-diffusion of a contaminant which occurs at the side of furnace opening 16, from the furnace opening portion space 21 to the substrate processing space 20. In the example shown in the drawing, the reverse-diffusion preventing body 8 is provided on the side of the furnace opening flange 7. That is, the arrangement is such that the reverse-diffusion preventing body 8 extends radially inwardly from the inner wall of the furnace opening flange 7, that the boat susceptor 19 can be located under the reverse-diffusion preventing body 8 in such a condition as to insert the boat 6 into the reaction tube 2, and that the respective tips of the reverse-diffusion preventing body 8 and the boat susceptor 19 are overlapped each other as shown in the drawing. And at the same time, a clearance 22 for allowing rotation of the boat 6 is surely provided between the tip of the reverse-diffusion preventing body 8 and that of the boat susceptor 19.

Figure 2:
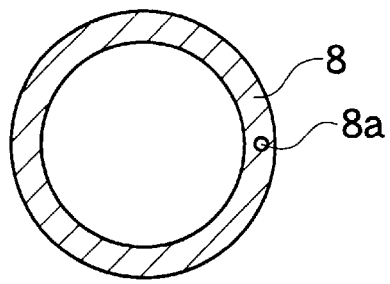
FIG. 2 is a plan view of a reverse-diffusion preventing body of an embodiment.

As shown in the plan view of FIG. 2, the reverse-diffusion preventing body 8 is of a ring-shaped configuration with an opening in the center for inserting the boat 6 through the opening, and a nozzle aperture 8a is formed in a portion of the ring for inserting through the aperture a vertical portion 4b of a gas introducing nozzle 4 which will be described below. For the reverse-diffusion preventing body 8, a material with high heat resistance and with as small amount of a contaminant as possible, such as quartz, Sic and so on, is used.

(B) Next, a purge gas is allowed to flow through the furnace opening portion space 21 as well as an atmosphere of the furnace opening portion space 21 is exhausted. That is, at the lower portion of the furnace opening flange 7 which defines the furnace opening portion space 21, a furnace opening exhausting tube 15 is provided which exhausts the furnace opening portion space 21 independently of the substrate processing space 20. The furnace opening exhausting tube 15 together with a valve, a pump and the like which are not shown in the drawing constitutes a furnace opening exhausting system. In addition, a purge gas supplying tube 10 is connected to the lower portion of the furnace opening flange 7 so that the purge gas is supplied from the purge gas supplying tube 10 into the furnace opening portion space 21 and the purge gas to exhausted from the above-mentioned furnace opening exhausting tube 15. For the, purge gas, an inert gas such as $N_2$ and the like, or $H_2$ gas is used. The purge gas supplying tube 10 together with a gas supplying tube and a gas supplying source which are not shown in the drawings constitutes a purge gas introducing system.

(C) In addition, the reaction gas is directly supplied to the side of the substrate processing space 20. That is, the gas introducing nozzle 4 which is inserted horizontally from the lower portion of the furnace opening flange 7 constituting the furnace opening portion space 21, not only extends inside the furnace opening portion space 21 but also enters vertically into the substrate processing space 20 through the nozzle aperture 8a in the reverse-diffusion preventing body 8 and finally extends to the vicinity of the upper portion of the reaction tube 2. As a result thereof, the reaction gas can be supplied directly to the substrate processing space 20 from the upper portion of the reaction tube 2. The supplied reaction gas flows downwardly from the upper portion of the reaction tube 2 while contacting the wafers 5 which are loaded being in a multi-storied fashion in the boat 6, and then, the supplied reaction gas is exhausted from the gas exhausting tube 14 which is provided at the lower portion of the substrate processing space 20, as indicated by arrows. Therefore, the flow of the gas in the reaction atmosphere in which the wafers 5 are present is from above to below.

Next, the function of the above-mentioned construction will be explained in the furnace opening flange 7 and seal cap 17, many O-rings 11 for vacuum sealing are used. As a result, a component of the O-ring may be released from the O-ring in the form of a gas, or an outside atmosphere may get into a furnace by leakage from the sealing to thereby cause a contamination source of the reaction atmosphere. In addition, the boat rotating mechanism 13 may be another contamination source and these contamination sources are intensively located on the side of the furnace opening 16 at the lower portion of the reaction furnace, as stated above.

According to the construction of the above-mentioned embodiment, the reverse-diffusion preventing body 8 is provided between the substrate processing space 20 and the furnace opening portion space 21 of the reaction furnace A so that the substrate processing space 20 is isolated from the furnace opening portion space 21 containing the contamination sources to thereby provide resistance against the flow of the contaminant from the furnace opening portion space 21 into the substrate processing space 20.

In addition to the reverse-diffusion preventing body 8, the furnace flange 7 is provided with the furnace opening exhausting tube 15 and the purge gas supplying tube 10 which are in fluid communication with the furnace opening portion space 21 so that a purge gas is supplied to the furnace opening portion space 21 when the furnace opening portion space 21 being evacuated to vacuum. As is explained, the reverse-diffusion preventing body 8 is provided between the substrate processing space 20 and the furnace opening portion space 21, and the furnace opening portion space 21 is exhausted independently of the substrate processing space 20. Therefore, the furnace opening portion space 21 and the substrate processing space 20 do not interfere with each other so as to surely exhaust the contaminant from the furnace opening portion space 21 to the furnace opening exhausting tube L, so that the reverse-diffusion of the contaminant from the furnace opening portion space 21 to the substrate processing space 20 can be effectively prevented.

Further, the gas introducing nozzle 4 which is inserted into the furnace flange 7 is not only extended to the furnace opening portion space 21 but also inserted into the substrate processing space 20. Therefore, the reaction gas does not contact with the atmosphere inside the furnace opening portion space 21 so that the contaminant occurring at the furnace opening portion B cannot be involved in the substrate processing space 20 when the reaction gas is introduced into the reaction furnace. Furthermore, since the gas introducing nozzle 4 inserted into the substrate processing space 20 extends to the upper portion of the reaction tube 2, the gas flows downwardly from upside in the reaction atmosphere in which the wafers 5 are contained. As a result thereof, the contaminant occurring at the furnace opening portion B is less apt to flow into the substrate processing space 20.

Here, the film formation procedures and the process conditions which are carried out in the above-mentioned reaction furnace of a vertical apparatus are as follows. The number of wafers to be processed is, for example, 50 of 8 inch wafers. The film formed on the silicon wafers is set to be an SiGe film and the reaction gas used for forming the film is a mixed gas wherein gases of monosilane ($SiH_4$), monogermane ($GeH_4$), monomethylsilane ($CH_3SiH_3$), diborane ($B_2H_6$) and a hydrogen ($H_2$) are simultaneously supplied.

A temperature of the wafers 5 which are loaded in the reaction tube 2 is raised up to 750° C. under a pressure of 30 Pa under conditions in which only hydrogen ($H_2$) flows. Then, the wafer surface is cleaned while the condition in which only hydrogen ($H_2$) flows is preserved. The temperature is lowered to 500° C. while the pressure is maintained at a constant level, and then, the above-stated mixed gas is allowed to flow. According to this, a boron (B) doped film of silicon germanium (SiGe) or a carbon (C) and boron (B) doped film of silicon germanium (SiGe) can be obtained. A thickness of the film is set to be 50 nm, for example, in the case of HBT (Hetero junction Bipolar Transistor) applications. In addition, a pressure is kept at such a constant level as is appropriate for a film formation condition as stated above, but it can be an appropriate value which is different from the one for substrate surface cleaning. When the wafers are exchanged after the film formation, the boat 6 is moved downwardly. The reverse-diffusion preventing body 8 remains inside the furnace then because the body 8 is provided on the side of the furnace flange 7.

In the embodiment as stated above, the reverse-diffusion preventing plate 8 is provided. Moreover, while a purge gas such as $N_2$, $H_2$ or the like is introduced into the furnace opening portion space 21, the space 21 is exhausted from the furnace opening exhausting tube 15 intended for the purpose, and further, the reaction gas is introduced directly into the substrate processing space 20 so as to make the gas flow from above to below in the reaction atmosphere. Therefore, even if moisture in the air is mixed by a very small amount of leakage from the sealing portion or a contaminant occurs from the O-ring 11 for sealing or from the boat rotation mechanism 13, the reverse-diffusion of the contaminants can be effectively prevented so that these contaminants at the lower portion of the reaction furnace cannot be carried to the wafers 5, which can keep a highly clean reaction atmosphere in the reaction chamber As a result, a haze never occurs and a good quality epitaxial film can be formed.

The vertical apparatus of the embodiment as shown above, can eliminate the contaminants of the most dominant portion of the contamination sources effectively, to thereby be a predominant technique for generating SiGe film requiring formation of a good quality film which is required to meet strict conditions of contamination by contaminants.

Figure 3:
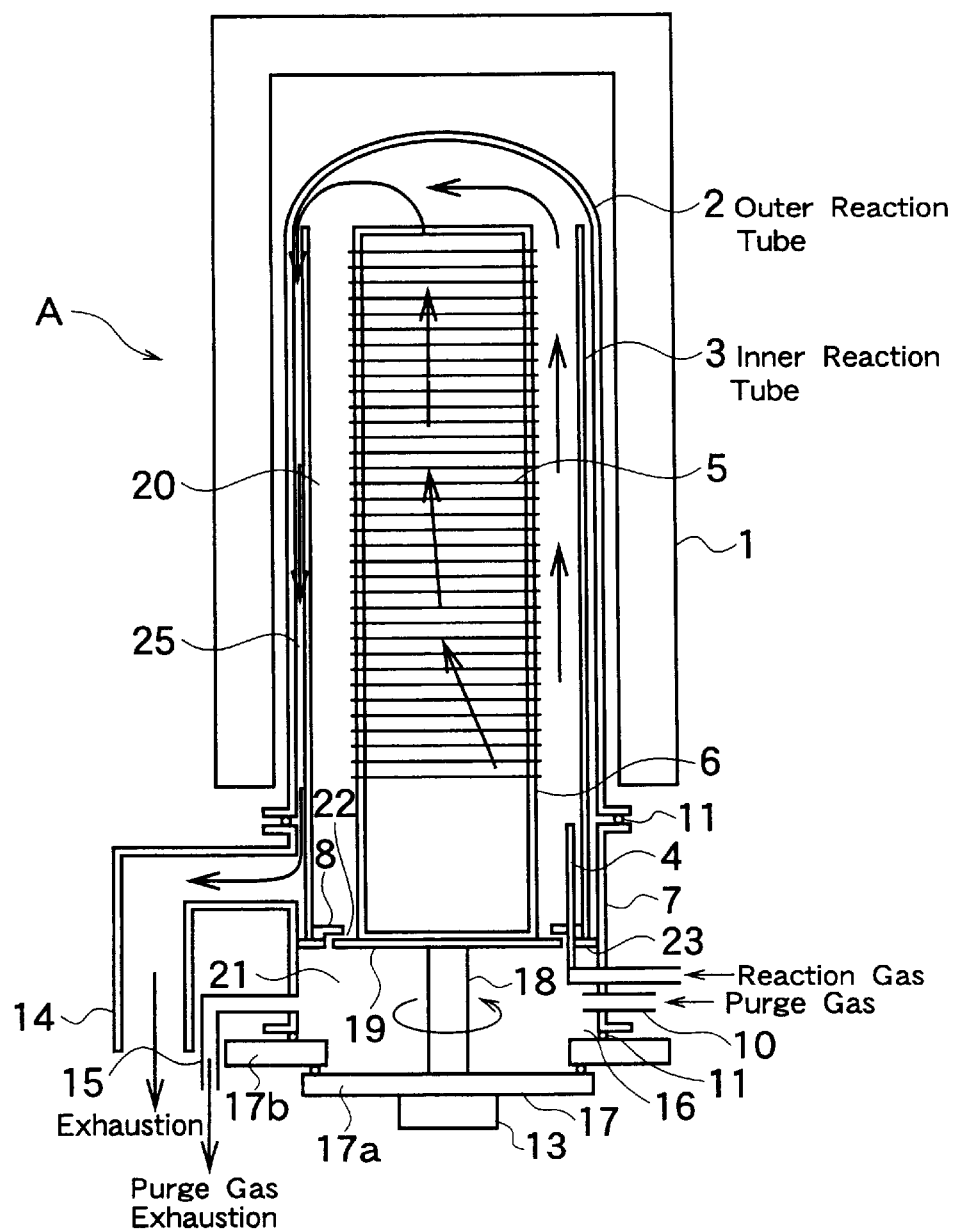
FIG. 3 is a schematic cross-sectional view for explaining a reaction furnace (double tube structure) of a vertical apparatus of an embodiment.

Next, a second embodiment will be explained using FIG. 3. The difference from the first embodiment is that the reaction furnace has a double tube structure. FIG. 3 is almost the same as FIG. 1 except this point and same reference numerals will be used for corresponding elements shown in FIG. 1.

The cylindrical outer reaction tube 2 made of quartz is provided inside the cylindrical heater 1 the upper portion of which is closed, and a cylindrical inner reaction tube 3 made of quarts the upper end of which is opened is disposed concentrically inside the outer reaction tube 2. The outer reaction tube 2 is vertically disposed on the upper end of the furnace opening flange 7, and the outer reaction tube 2 and the furnace opening, flange 7 are sealed therebetween by the O-ring 11. The inner reaction tube 3 is vertically disposed on a reaction tube receiving portion 23 which extends radially inwardly from the inner wall of the furnace opening flange 7. The lower end of the furnace opening flange 7 is airtightly covered by the seal cap 17 via the O-ring 11. The boat 6 which is vertically disposed on the seal cap 17 is inserted into the inner reaction tube 3. In the boat 6, the wafers 5 such as silicon wafers and so on to be subjected to film-formation processing are arranged to be loaded being horizontally oriented in a multi-storied fashion such that the plurality of wafers 5 can be subjected to batch processing. With the furnace opening flange 7 being airtightly sealed by the seal cap 17, the closed space is formed by the inner reaction tube 3 and the furnace opening flange 7 mutually being in fluid communication. The above-mentioned reaction tube receiving portion 23 is disposed on the position opposite to the boat susceptor 19 in a condition wherein the boat 6 is inserted in the inner reaction tube 3.

In the second embodiment, three constructions are added for preventing contamination of the furnace opening portion as in the case of the first embodiment. That is, on the reaction tube receiving portion 23, the ring-shaped reverse-diffusion preventing body 8 is disposed the tip of which is overlapped with the tip of the boat susceptor 19, so that the substrate processing space 20 and the furnace opening portion space 21 are separated. In addition, the purge gas supplying tube 10 and the furnace exhausting tube 15 are provided to allow the purge gas of the furnace opening portion space 21 to flow and be exhausted at the same time, and the gas introducing nozzle 4 is extended to introduce the reaction gas directly into the substrate processing space The gas introducing nozzle 4 does not extend to the upper portion of the outer reaction tube 2 but only to the lower portion of the boat 6, being different from the first embodiment. When the gas introducing nozzle 4 extends to the upper portion just as in the first embodiment, the reaction gas is exhausted without contacting the wafers 5. Therefore, the gas introducing nozzle 4 inserted into the substrate processing space 20 is allowed to extend not to the upper portion but only to the lower portion of the boat 6. As a result, the reaction gas rises from the lower portion of the inner reaction tube 3 while contacting the wafers 5 which are loaded being in multi-storied fashion in the boat 6, and after rising, the reaction gas reverses its flow direction, and then, it flows down through a passage 25 formed between the inner reaction tube 3 and the outer reaction tube 2 to be exhausted from the lower portion of the passage 25. Therefore, the gas flows upwardly in the reaction atmosphere in which the wafers 5 exist.

In the above-stated double tube structure reaction furnace of the vertical apparatus, the reverse-diffusion preventing body 8 is also used to separate the furnace opening portion space 21 from the substrate processing space 20, and moreover, the purge gas is introduced in and exhausted out from the furnace opening portion space 21 and the reaction gas is introduced directly into the substrate processing space 20. This makes it possible to keep a highly clean reaction atmosphere in the substrate processing space 20 from being subject to contamination from the furnace opening portion B. Therefore, a high quality film can be generated regardless of the inner reaction tube 3 and a gas flow direction in the reaction atmosphere in which the wafers exist.

In addition, in the above-stated first and second embodiments, the tips of the reverse-diffusion preventing body 8 and the boat susceptor 19 are overlapped mutually. However, the reverse-diffusion preventing body 8 and the boat susceptor 19 may simply be disposed oppositely each other without such overlapping, and the clearance of their tips may be set narrow to the possible extent.

Figure 4:
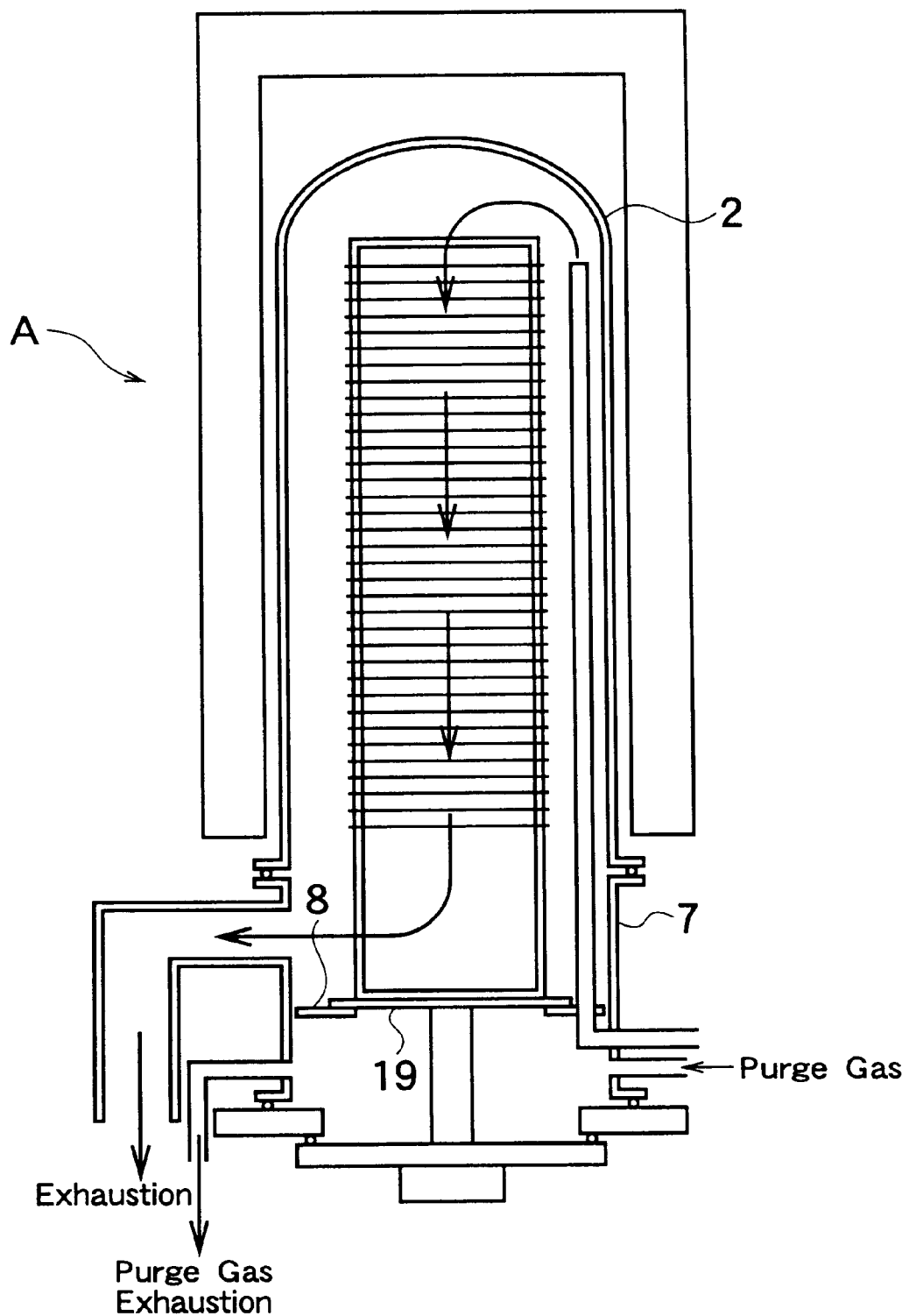
FIG. 4 is a schematic cross-sectional view for explaining a reaction furnace (single tube structure) of a vertical apparatus of an embodiment.
Figure 5:
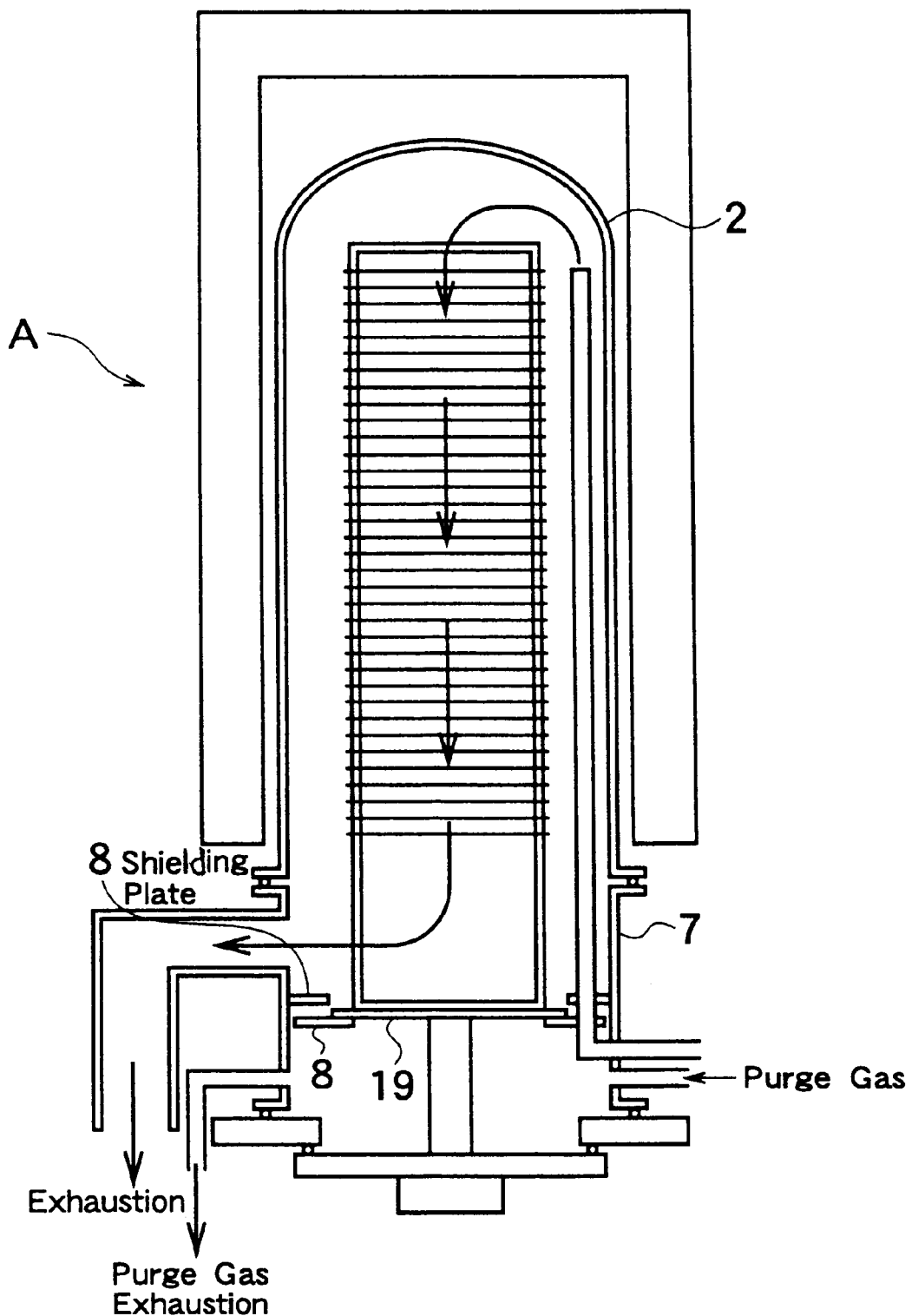
FIG. 5 is a schematic cross-sectional view for explaining a reaction furnace (single tube structure) of a vertical apparatus of an embodiment.
Figure 6:
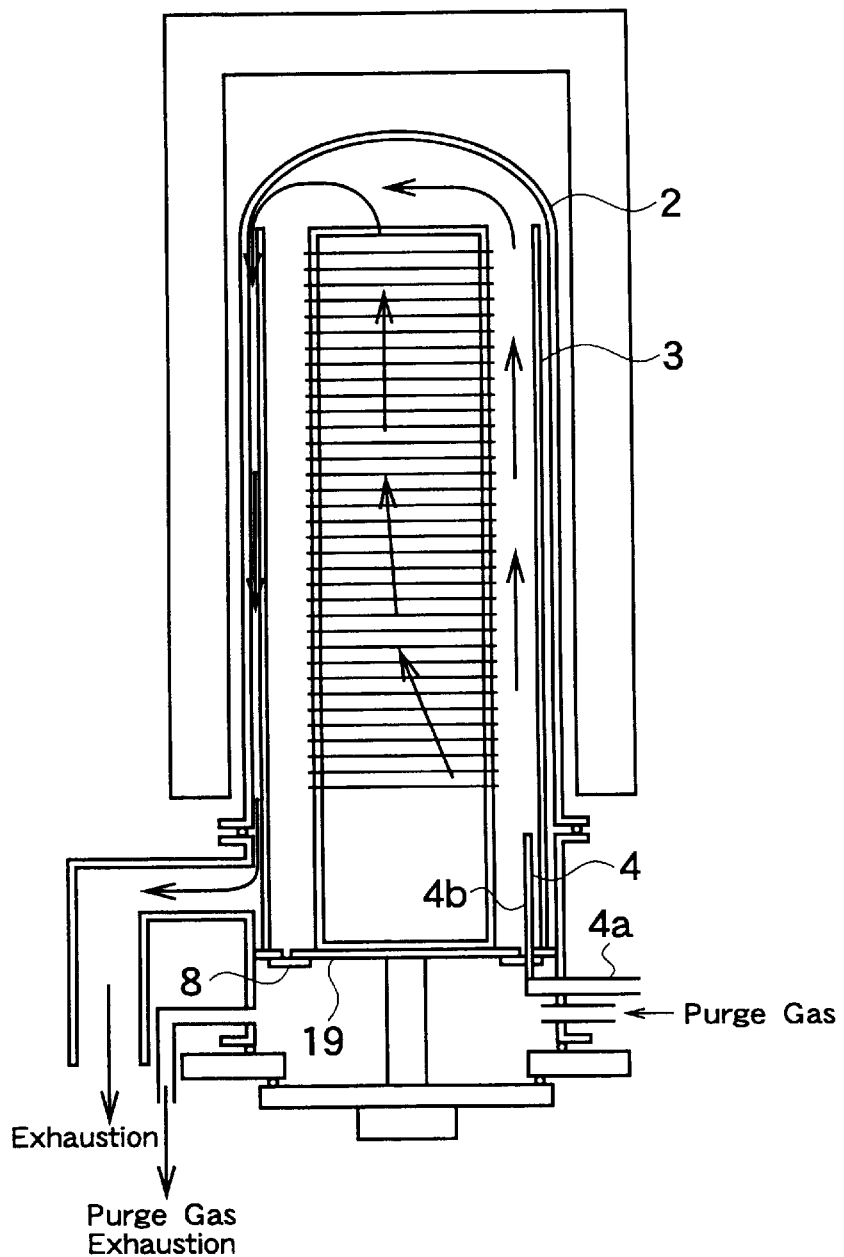
FIG. 6 is a schematic cross-sectional view for explaining a reaction furnace (double tube structure) of a vertical apparatus of an embodiment.

Further, in the above-stated two embodiments, the reverse-diffusion preventing body 8 disposed between the substrate processing space 20 and the furnace opening portion space 21 is disposed on the side of the furnace opening flange 7 because the boat 6 rotates. However, when the boat 6 does not have a rotation mechanism 13 and it does not rotate, it may be disposed on the side of the boat susceptor 19 or on both the sides of the boat susceptor 19 and the furnace opening flange 7, as shown in FIGS. 4 to 6. FIG. 4 shows the single tube structure reaction furnace A wherein the reverse-diffusion preventing body 8 is disposed on the boat susceptor 19, FIG. 5 shows the single tube structure reaction furnace A wherein the reverse-diffusion preventing body 8 is disposed on both the sides of the furnace opening flange 7 and the boat susceptor 19, and FIG. 6 shows the double tube structure reaction furnace wherein the reverse-diffusion preventing body 8 is disposed on the boat susceptor 19, respectively. In short, the reverse diffusion preventing body 8 may be disposed on either side so long as it can prevent contaminants from diffusing in the reverse direction to a gas flow.

Figure 7:
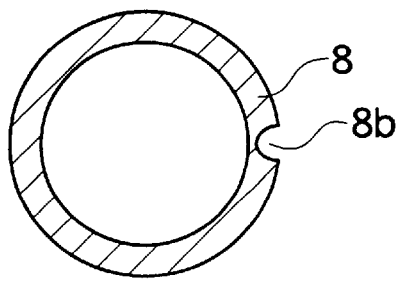
FIG. 7 is a plan view of a reverse-diffusion preventing body of an embodiment.

When this reverse diffusion preventing body 8 is provided on both sides of the boat susceptor 19 and the furnace opening flange 7 (see FIG. 5), contaminants can be more effectively reduced if both the members are in non-contacting and partly overlapped relation. In addition, when the reverse diffusion preventing body 8 is provided on the side of the boat susceptor 19, the reverse diffusion preventing body 8 should be provided under the boat susceptor 19 in order for the boat to move up and down (see FIGS. 5 and 6). Additionally, as illustrated in FIG. 7, a notch 8b which does not interfere with the horizontal portion 4a of the gas introducing portion 4 should be provided on the periphery of the reverse diffusion preventing body 8. Further, the reverse diffusion preventing body 8 is attached to the boat susceptor 19, however, the boat susceptor 19 itself may be radially enlarged. Furthermore, since the boat susceptor 19 is not always an appropriate boundary between the furnace opening portion space and the substrate processing space, it may be attached to the other portion on the side of the boat 6 which is suitable for a boundary.

Moreover, even if the boat 6 rotates, the reverse-diffusion preventing body 8 may be disposed on the side of the boat susceptor 19, when the gas introducing nozzle 4 comprises only the horizontal portion 4a in order not to directly introduce the reaction gas into the substrate processing space 20. The notch 8b which allows the boat 6 to move up and down is necessary for the reverse-diffusion preventing body 8.

In addition, when the pressure of the furnace opening portion space 21 is set to be lower than that of the substrate processing space 20, the reverse-diffusion of the contaminants can be prevented further. In this case, the above-stated gas exhausting tube 14 and the furnace exhausting 15 may be connected to one common pump, but it is easier to set the pressure of the furnace opening portion space 21 to be lower when they are separately connected to respective pumps.

Further, in the above-stated two embodiments, a purge gas is supplied to the furnace opening portion space 21 when being evacuated to vacuum, but only evacuation to vacuum by the furnace opening exhausting system may be also suitable. This also makes it possible to prevent a haze from occurring on the wafers 5. However, it is preferable to perform a furnace opening purge in order to prevent carbon contamination (organic contamination) more effectively.

Furthermore, a slim reaction tube is preferably used for reaction tubes 2 and 3. The slim reaction tube mentioned here means a tube which has a smaller inner diameter compared to a standard one so as to inevitably allow a distance between the inner wall of the reaction tube and the wafers 5 shorter. For the single tube structure of FIG. 1 the reaction tube 2 may be the slim tube, and for the double tube structure of FIG.3, the inner reaction tube 3 may be the slim one. Thus, the shorter the distance between the reaction tube wall and the wafers 5 is allowed to be, the more possible it is to prevent the film from being extremely thick only at a periphery of the wafers, and as a result, the film thickness uniformity can be improved. In addition, the reaction tubes 2 and 3 are not described as slim tubes in FIG. 1 and FIGS. 3 to 6.

Moreover, in the embodiment, a specific vertical apparatus has been explained as an SiGe film formation apparatus, but the present invention is not limited to the SiGe film formation apparatus. The present invention can be applied to a polysilicon system film, an oxidation film or an annealing, and it is generally applicable to substrate processing apparatuses such as a surface processing apparatus, a film formation apparatus and an epitaxial film formation apparatus.

In addition, the present invention can be applied to single wafer mode substrate processing apparatuses as well as batch mode substrate processing apparatuses. In other words, the present invention can also be applied to substrate processing apparatuses for processing at least a single substrate such as wafer and the like in the substrate processing space inside the furnace.

According to the present invention, the reverse-diffusion preventing body is provided for preventing the diffusion of the contaminant from the furnace opening portion space inside the furnace to the substrate processing space so as to exhaust the furnace opening portion space. As a result thereof, the substrate processing can be performed in a highly clean reaction atmosphere without contamination. In addition, the furnace opening portion space is further purged while being exhausted so that the contamination can be effectively eliminated. Moreover, the reaction gas is directly introduced in the substrate processing space so that the contamination can be still more effectively eliminated. Furthermore, the pressure of the furnace opening space is set to be lower than that of the substrate processing space so that the contamination can be dramatically reduced.

What is claimed is:

1. A substrate processing apparatus comprising:
   a furnace for processing at least a single substrate therein, with a furnace opening covered with a seal cap;
   a reverse-diffusion preventing body, provided between a substrate processing space and a furnace opening portion space at a side of the furnace opening, within said furnace, for preventing reverse-diffusion of a contaminant at the side of the furnace opening from said furnace opening portion space to said substrate processing space;
   a reaction gas introducing system for introducing a reaction gas into said furnace so as to process said substrate;
   a process exhausting system for exhausting said introduced reaction gas from said substrate processing space; and
   a furnace opening exhausting system for exhausting said furnace opening portion space independently of said substrate processing space.

2. A substrate processing apparatus according to claim 1, comprising a purge gas introducing system for purging an inside of said furnace opening portion space by supplying an inert gas such as $N_2$ and the like, or $H_2$ gas into said furnace opening portion space.

3. A substrate processing apparatus according to claim 2, wherein a pressure of said furnace opening portion space is kept lower than a pressure of said substrate processing space.

4. A substrate processing apparatus according to claim 3, wherein said reaction gas introducing system is configured to directly supply said reaction gas into said substrate processing space.

5. A substrate processing apparatus according to claim 4, wherein the process of said substrate is a process for forming an epitaxial film onto a substrate surface.

6. A substrate processing apparatus according to claim 3, wherein the process of said substrate is a process for forming an epitaxial film onto a substrate surface.

7. A substrate processing apparatus according to claim 2, wherein said reaction gas introducing system is configured to directly supply said reaction gas into said substrate processing space.

8. A substrate processing apparatus according to claim 7, wherein the process of said substrate is a process for forming an epitaxial film onto a substrate Surface.

9. A substrate processing apparatus according to claim 2, wherein the process of said substrate is a process for forming an epitaxial film onto a substrate surface.

10. A substrate processing apparatus according to claim 2, wherein a pressure of said furnace opening portion space is kept lower than a pressure of said substrate processing space.

11. A substrate processing apparatus according to claim 10, wherein said reaction gas introducing system is configured to directly supply said reaction gas into said substrate processing space.

12. A substrate processing apparatus according to claim 11, wherein the process of said substrate is a process for forming an epitaxial film onto a substrate surface.

13. A substrate processing apparatus according to claim 10, wherein the process of said substrate is a process for forming an epitaxial film onto a substrate surface.

14. A substrate processing apparatus according to claim if wherein said reaction gas introducing system is configured to directly supply said reaction gas into said substrate processing space.

15. A substrate processing apparatus according to claim 14, wherein the process of said substrate is a process for forming an epitaxial film onto a substrate surface.

16. A substrate processing apparatus according to claim 1, wherein the process of said substrate is a process for forming an epitaxial film onto a substrate surface.

17. A method for manufacturing a semiconductor device, comprising the steps of:
   inserting at least a single semiconductor substrate into a furnace and covering a furnace opening with a seal cap;
   preventing reverse-diffusion of a contaminant at a side of the furnace opening from a furnace opening portion space at the side of the furnace opening to a substrate processing space, within said furnace:
   introducing a reaction gas into the furnace so as to process said semiconductor substrate;
   exhausting said introduced gas, from said substrate processing space; and
   exhausting said furnace opening portion space independently of said substrate processing space.

18. A method for manufacturing a semiconductor device, according to claim 17, wherein the reaction gas to be introduced into said furnace is a gas for forming an SiGe film.

* * * * *

UNITED STATES PATENT AND TRADEMARK OFFICE
CERTIFICATE OF CORRECTION

PATENT NO.    : 6,503,079 B2
DATED         : January 7, 2003
INVENTOR(S)   : Minoru Kogano et al.

It is certified that error appears in the above-identified patent and that said Letters Patent is hereby corrected as shown below:

Column 11,
Line 43, "claim 2," should read -- claim 1, --;

Column 12,
Line 10, "Surface" should read -- surface --; and
Line 28, "claim if" should read -- claim 1, --.

Signed and Sealed this

Eighteenth Day of March, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,503,079 B2
DATED : January 7, 2003
INVENTOR(S) : Minoru Kogano et al.

It is certified that error appears in the above-identified patent and that said Letters Patent is hereby corrected as shown below:

Column 11,
Line 48, "claim 2," should read -- claim 1, --.

Signed and Sealed this

Twenty-ninth Day of July, 2003

JAMES E. ROGAN
*Director of the United States Patent and Trademark Office*